United States Patent
Tan

(10) Patent No.: US 10,432,141 B2
(45) Date of Patent: Oct. 1, 2019

(54) MULTIMODE VOLTAGE CONTROLLED OSCILLATOR

(71) Applicant: QUALCOMM Incorporated, San Diego, CA (US)

(72) Inventor: Jun Tan, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 99 days.

(21) Appl. No.: 15/187,710

(22) Filed: Jun. 20, 2016

(65) Prior Publication Data

US 2017/0179883 A1 Jun. 22, 2017

Related U.S. Application Data

(60) Provisional application No. 62/269,811, filed on Dec. 18, 2015, provisional application No. 62/337,579, filed on May 17, 2016.

(51) Int. Cl.
| | |
|---|---|
| *H03B 5/12* | (2006.01) |
| *H03F 3/19* | (2006.01) |
| *H03F 3/24* | (2006.01) |
| *H03G 3/30* | (2006.01) |

(Continued)

(52) U.S. Cl.
CPC ............ *H03B 5/1243* (2013.01); *H03B 5/00* (2013.01); *H03B 5/12* (2013.01); *H03B 5/1212* (2013.01); *H03B 5/1215* (2013.01); *H03B 5/1228* (2013.01); *H03B 5/1265* (2013.01); *H03B 5/1296* (2013.01); *H03F 3/19* (2013.01); *H03F 3/24* (2013.01); *H03F 3/245* (2013.01); *H03G 3/3042* (2013.01); *H03B 2200/009* (2013.01); *H03F 2200/165* (2013.01); *H03F 2200/171* (2013.01); *H03F 2200/294* (2013.01); *H03F 2200/333* (2013.01); *H03F 2200/451* (2013.01); *H03L 7/099* (2013.01)

(58) Field of Classification Search
CPC .......... H03B 5/12; H03B 5/00; H03B 5/1228; H03B 5/1296; H03B 5/1215; H03F 3/24
USPC .................. 331/175, 117 FE, 167, 182, 183
See application file for complete search history.

(56) References Cited

U.S. PATENT DOCUMENTS

| | | |
|---|---|---|
| 7,102,454 B2 | 9/2006 | Sze et al. |
| 8,988,158 B2 | 3/2015 | Rong et al. |
| 9,048,783 B2 | 6/2015 | Liscidini et al. |

(Continued)

OTHER PUBLICATIONS

Written Opinion—PCT/US2016/066299—ISA/EPO—dated Apr. 7, 2017.

(Continued)

*Primary Examiner* — Arnold M Kinkead
(74) *Attorney, Agent, or Firm* — Haynes and Boone, LLP

(57) ABSTRACT

Features and advantages of the present disclosure include a multimode voltage controlled oscillator (VCO). In one embodiment, a circuit comprises a VCO, first and second transistors, and first and second capacitive attenuators. The first and second transistors are cross coupled through the attenuators. In a first mode, the first and second transistors are turned off, and the capacitive attenuators attenuate a signal on output terminals of the VCO at control inputs of the first and second transistors. In another mode, the first and second transistors are turned on, and the capacitive attenuation is reduced or turned off so that control inputs of the first and second transistors receive signals on the outputs of the VCO.

19 Claims, 8 Drawing Sheets

(51) Int. Cl.
    *H03B 5/00*       (2006.01)
    *H03L 7/099*      (2006.01)

(56) References Cited

U.S. PATENT DOCUMENTS

| | | |
|---|---|---|
| 2013/0222070 A1 | 8/2013 | Liscidini et al. |
| 2014/0009236 A1 | 1/2014 | Choi et al. |
| 2014/0266479 A1* | 9/2014 | Rong .................. H03B 5/1228 331/117 FE |
| 2014/0266481 A1 | 9/2014 | Shanan |

OTHER PUBLICATIONS

International Search Report—PCT/US2016/066299—ISA/EPO—dated Apr. 7, 2017.

Kim C-H., et al., "A Low Phase Noise and Low Power Series Coupled Quadrature VCO using Reconfigurable LC Tank," IEEE Radio and Wireless Symposium, 2008, pp. 395-398.

Antonio Liscidini, Luca Fanori, Pietro Andreani, and Rinaldo Castello, "A 36mW/9mW Power-Scalable DCO in 55mm CMOS for GSM/WCDMA Frequency Synthesizers," IEEE International Solid-State Circuits Conference, pp. 348-350, Feb. 22, 2012.

* cited by examiner

MULTIMODE VOLTAGE CONTROLLED OSCILLATOR

CROSS REFERENCE TO RELATED APPLICATIONS

Pursuant to 35 U.S.C. § 119(e), this application is entitled to and claims the benefit of the filing date of U.S. Provisional App. No. 62/269,811 filed Dec. 18, 2015; and the benefit of U.S. Provisional App. No. 62/337,579 filed May 17, 2016 the content of both of which are hereby incorporated herein by reference in their entireties for all purposes.

BACKGROUND

The present disclosure relates to voltage controlled oscillators, and in particular, to a multimode voltage controlled oscillator.

Many electronic systems require some kind of signal to control timing of the circuits and functions of the system. One common circuit for generating a timing signal is a voltage controlled oscillator (VCO). VCOs typically receive an input voltage and produce a periodic signal having a frequency determined by the input voltage.

One common VCO architecture uses differential cross coupled NMOS transistors with drains connected across a voltage controlled inductor/capacitor (LC) tank circuit. Such circuits are known to operate at very high frequencies with large voltage swings, but they can consume a great deal of power. Another common VCO architecture uses cross coupled CMOS devices (PMOS and NMOS transistors) across an LC tank. CMOS VCOs consume less power, but may have more phase noise and a lower voltage swing than NMOS VCOs.

A multimode VCO may switch between an NMOS mode and CMOS mode. However, the performance of such an architecture may suffer if large capacitances in the circuit interfere with the capacitance of the LC tank, for example. Additionally, voltage swings in NMOS mode should not be impacted by circuitry that is only used in CMOS mode. Further, switching circuits to reconfigure the VCO between modes may degrade performance by reducing tuning range or degrading phase noise, for example.

Embodiments described herein disclose a multimode VCO that may overcome these and other challenges.

SUMMARY

Features and advantages of the present disclosure include a multimode voltage controlled oscillator (VCO). In one embodiment, a circuit comprises a VCO, first and second transistors, and first and second capacitive attenuators. The first and second transistors are cross coupled through the attenuators. In a first mode, the first and second transistors are turned off, and the capacitive attenuators attenuate a signal on output terminals of the VCO at control inputs of the first and second transistors. In another mode, the first and second transistors are turned on, and the capacitive attenuation is reduced or turned off so that control inputs of the first and second transistors receive signals on the outputs of the VCO.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
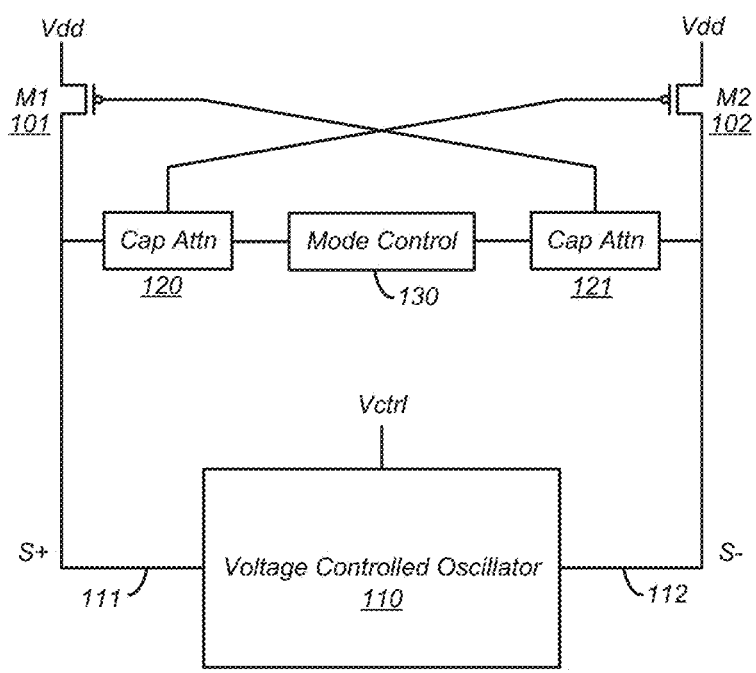
FIG. 1 illustrates a voltage controlled oscillator circuit according to an embodiment.

FIG. 1 illustrates voltage controlled oscillator (VCO) circuit according to an embodiment. Embodiments of the present disclosure include a VCO having a periodic signal that may be selectively attenuated and non-attenuated and coupled to control terminals of transistors in the circuit in different modes of operation, for example. Example embodiments may support multimode operation where in one mode, capacitive attenuator circuits attenuate a signal across the voltage controlled oscillator when certain transistors are turned off, and in a second mode, the capacitive attenuator circuits do not attenuate the signal across the voltage controlled oscillator when the transistors are turned on (e.g., in a cross coupled configuration). In one example implementation described below, a VCO may operate in an NMOS only mode or in a CMOS mode.

As illustrated in FIG. 1, a VCO 110 may generate a differential signals S+ and S− on terminals 111 and 112. Example VCOs according to various embodiments may include one or more inductors, one or more capacitors, and may include cross coupled transistors, examples of which are described below. Embodiments of the present disclosure may include a first transistor M1 101 and a second transistor M2 102. In some embodiments, transistors 101 and 102 may have an opposite device type than the cross coupled transistors in the VCO 110, for example. Transistors 101 and 102 may be PMOS transistors and cross coupled transistors in VCO 110 may be NMOS transistors, for example, and the circuit may be operable in both PMOS only mode and a CMOS mode where the NMOS and PMOS transistor are both on, for example. It is to be understood that other device types arrangements may use the features and techniques described herein. First and second capacitive attenuator circuits 120 and 121 are included with a mode control circuit 130. As shown, a terminal (e.g., a drain) of first transistor 101 is cross coupled to the control terminal (e.g., a gate) of the second transistor 102 through a first capacitive attenuator circuit 120, and a terminal of second transistor 102 is similarly cross coupled to a control terminal of first transistor 101 through the second capacitive attenuator circuit 121.

In one embodiment, mode control circuit 130 may configure the circuit in multiple modes. For example, in a first mode, the first and second capacitive attenuator circuits 120 and 121 attenuate the differential signal (e.g., S+ and S−) across VCO 110 when the first and second transistors 101 and 102 are turned off. In a second mode, the first and second capacitive attenuator circuits 120 and 121 do not attenuate the signal across VCO 110 (or attenuate less) and the first and second transistors 101 and 102 are turned on in a cross coupled configuration. In a particular example, the circuit may be configured in a CMOS mode of operation, and S+ may be capacitively coupled (e.g., unattenuated) to the control terminal of transistor 102 and S− may be capacitively coupled (e.g., unattenuated) to the control terminal of transistor 101, for example. In this case, the circuit may also be configured in an NMOS mode of operation, where transistors 101 and 102 are turned off and S+ is capacitively attenuated to the control terminal of transistor 102 and S− is capacitively attenuated to the control terminal of transistor 101. As described in more detail below, example implementations may change a bias voltage at the control terminals of transistors 101 and 102, for example, to turn off transistors 101 and 102 in NMOS mode.

Figure 2:
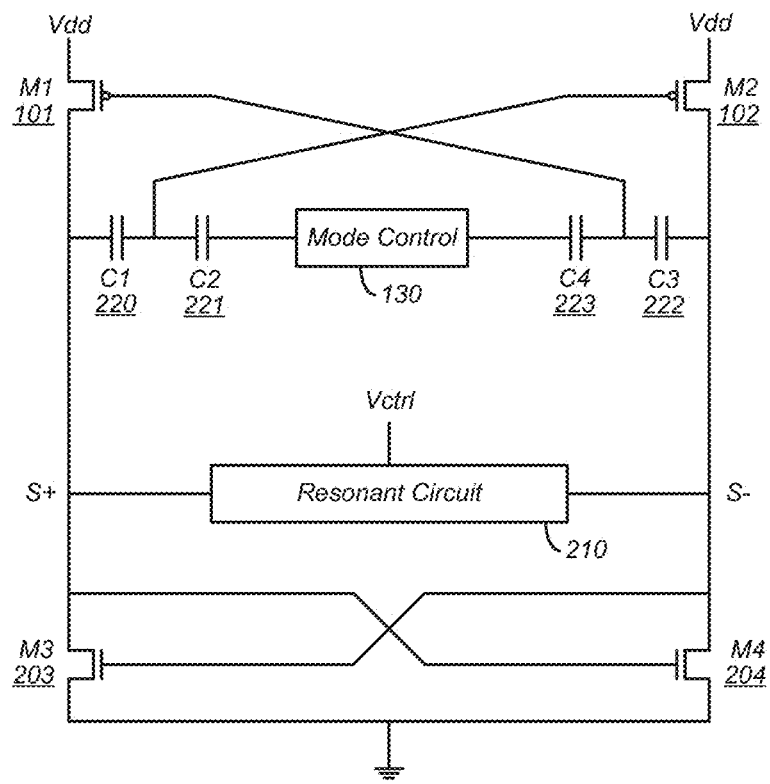
FIG. 2 illustrates another voltage controlled oscillator circuit according to an embodiment.

FIG. 2 illustrates another voltage controlled oscillator circuit according to an embodiment. This example circuit includes a first transistor 101 of a first conductivity type (e.g., PMOS) having a control terminal (e.g., a gate), a first terminal (e.g., a source), and a second terminal (e.g., a drain) and a second transistor 102 of the first conductivity type (e.g., PMOS) having a control terminal (e.g., a gate), a first terminal (e.g., a source), and a second terminal (e.g., a drain). In this example, transistors 101 and 102 are cross coupled through series capacitors as described in more detail below. Transistors 101 is coupled to transistor M3 203 of a second conductivity type (e.g., NMOS) having a control terminal (e.g., a gate), a first terminal (e.g., a source), and a second terminal (e.g., a drain). The second terminal (here, the drain) of transistor 203 is coupled to the second terminal (here, the drain) of transistor 101. Similarly, transistor 102 is coupled to transistor M4 204 of a second conductivity type (e.g., NMOS) having a control terminal (e.g., a gate), a first terminal (e.g., a source), and a second terminal (e.g., a drain). The second terminal (here, the drain) of transistor 204 is coupled to the second terminal (here, the drain) of transistor 102. Transistors 203 and 204 may be cross coupled such that the gate of transistor 203 is coupled to the drain of transistor 204 and the gate of transistor 204 is coupled to the drain of transistor 203. The circuit in FIG. 2 further includes a resonant circuit 210 configured between a terminal of transistor 203 and a terminal of transistor 204. Resonant circuit 210 may include one or more inductors and one or more capacitors, for example. Resonant circuit 210 and cross coupled transistors M3/M4 may produce a differential periodic signal S+/S− having a particular frequency set by a control voltage, Vctrl, for example. An example resonant circuit is disclosed below, however it is to be understood that a variety of such resonant circuits are known to those skilled in the art. Accordingly, resonant circuit 210 and transistors M3/M4 are one example mechanism for generating a differential periodic signal in response to a control voltage, Vctrl, where the control voltage sets a frequency of the periodic signal.

In this example, capacitive attenuation is provided by capacitors C1-C4 220-223. For instance, capacitor 220 has a first terminal coupled to the second terminal (e.g., the drain) of PMOS transistor 101 and a second terminal coupled to the control terminal (e.g., the gate) of transistor 102. Capacitor 221 has a first terminal coupled to the second terminal of capacitor 220 so that the capacitors are in series. Similarly, capacitor 222 has a first terminal coupled to the second terminal (e.g., the drain) of PMOS transistor 102 and a second terminal coupled to the control terminal (e.g., the gate) of transistor 101. Capacitor 223 has a first terminal coupled to the second terminal of capacitor 222 so the capacitors are in series.

Second terminals of capacitor 221 and 223 are coupled to mode control circuit 130. In one embodiment, mode control circuit 130 may change the voltage on the capacitor terminals to change the attenuation of the capacitors, for example. For instance, in one embodiment, mode control circuit 130 may establish a virtual ground between the terminals of capacitors 221 and 223 so that series capacitors 220 and 221 attenuate signal S+ between the drain of M1 and the gate of M2 and series capacitors 222 and 223 attenuate signal S− between the drain of M2 and the gate of M1. In this configuration, attenuation of the series capacitors is a function of C1/(C1+C2) and C3/(C3+C4). For example, if C1 is approximately equal to C2, then the signal at the gate of M2 is S+(C1/(C1+C2))=S+/2. Similarly, if C3 is approximately equal to C4, then the signal at the gate of M1 is S−(C3/(C3+C4))=S−/2. Signals S+ and S− may form a differential periodic signal, for example. Accordingly, series capacitors C1/C2 and C3/C4 may provide one example mechanism for capacitively attenuating the differential periodic signal to produce a differential attenuated signal at the control terminals of M1 and M2, for example. As mentioned above and describe further below, the gates of M1 and M2 may be biased with different voltages to turn these devices on and off in different modes.

Furthermore, in another mode, mode control circuit 130 may present a high impedance at the terminals of capacitors 221 and 223. In this configuration, the effects of C2 and C3 can be reduced or approximately eliminated, and signals S+ and S− are AC coupled through C1 and C3 to the gates of M2 and M1, respectively. Accordingly, mode control circuit 130 provides a mechanism for selectively controlling the attenuation of the capacitive attenuators.

Figure 3:
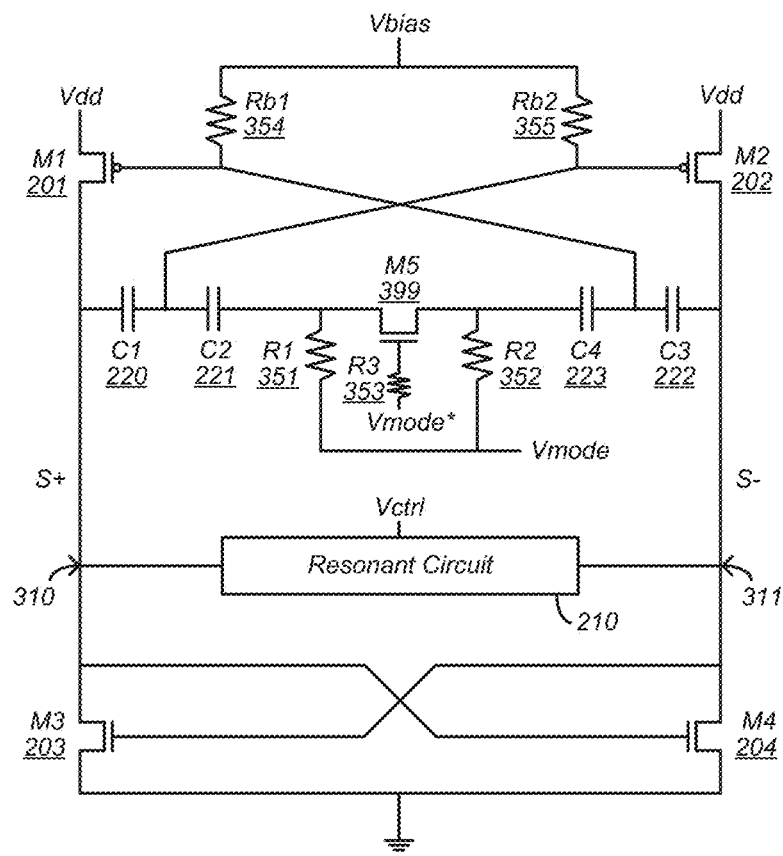
FIG. 3 illustrates an example circuit implementation of a voltage controlled oscillator according to another embodiment.

FIG. 3 illustrates an example circuit implementation of a VCO according to another embodiment. In this example, the circuit includes PMOS transistors 201 and 202, cross coupled NMOS transistors 203 and 204, resonant circuit 210, and series capacitors 220-223 configured between VCO output terminals having signals S+ and S− and gates of the PMOS devices as shown and as described above. In this example, control terminals of transistors 201 and 202 are coupled to a bias voltage, Vbias, through resistors Rb1 354 and Rb2 355, respectively. Specifically, in this example, resistor 354 has a first terminal coupled to the control terminal of transistor 201 and a second terminal coupled to bias voltage, Vbias. Similarly, resistor 355 has a first terminal coupled to the control terminal of transistor 202 and a second terminal coupled to the bias voltage, Vbias. In one embodiment, Vbias is changed between different voltages to turn transistors 201 and 202 on and off in different modes. For example, features and advantages of the present disclosure include coupling the control terminals of transistors 201 and 202 to a first bias voltage in a first mode of operation to turn on transistors 201 and 202 (e.g., in CMOS mode), and coupling the control terminals of transistors 201 and 202 to a second bias voltage in a second mode of operation to turn off transistors 201 and 202 (e.g., in NMOS mode). In this example, in a CMOS mode, Vbias may be set low to turn on transistors 201 and 202, and in an NMOS mode, Vbias may be increased to turn off transistors 201 and 202, for example.

FIG. 3 also illustrates an example implementation of a mode control circuit. In this example, a mode control circuit includes a switch having a first terminal coupled to a terminal of capacitor C2 221 and a second terminal coupled to a terminal of capacitor C4 223. In this example, the switch is implemented using an NMOS transistor M5 399, which is turned on and off by a mode control voltage, Vmode* coupled to the gate of transistor 399 through resistor R3 353, for example. It is to be understood that other embodiments may use other switch implementations. The mode control circuit in this example further includes a first resistor R1 351 having a first terminal coupled to a terminal of capacitor 221 and a second terminal coupled to a mode control voltage, Vmode. Similarly, mode control circuit includes a second resistor R2 352 having a first terminal coupled to a terminal of capacitor 223 and a second terminal coupled to mode control voltage, Vmode. Vmode* may be the inverse of Vmode such that when Vmode is high, Vmode* is low, and when Vmode is low, Vmode* is high, for example.

Transistor 399, resistors 351-352, and Vmode/Vmode* may selectively control capacitive attenuation. For example, when Vmode is low and Vmode* is high, transistor 399 is on (short circuit) and couples the terminals of capacitors 221 and 223 together to create a common mode (or virtual ground) node. In this state, C1/C2 and C3/C4 act as capacitive dividers that attenuate signals S+ and S−, respectively, between output terminals of the VCO 310 and 311 and gate terminals of the PMOS devices 201 and 202. Alternatively, when Vmode is high and Vmode* is low, transistor 399 is off (open circuit) and resistors R1 and R2 may present a high impedance on the terminals of C2 and C4. Accordingly, C2 and C4 may be effectively eliminated from the circuit so that S+ and S− are AC coupled through capacitors C1 and C3 to the gates of PMOS devices 201 and 202 without attenuation (or with reduced attenuation). Accordingly, R1, R2, and transistor 399 provide one example mechanism for selectively controlling the capacitive attenuation to generate a virtual ground and a high impedance in different modes.

Figure 4A:
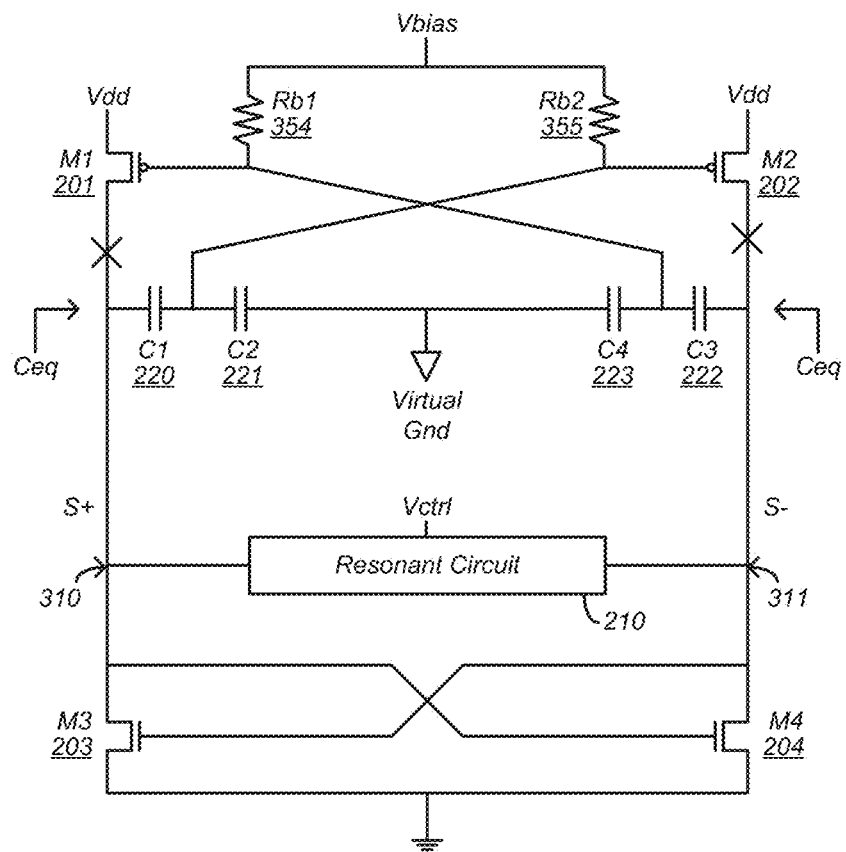
FIG. 4A illustrates the operation of the circuit of FIG. 3 in an NMOS mode according to an example embodiment.

FIG. 4A illustrates the operation of the circuit of FIG. 3 in an NMOS mode according to an example embodiment. In NMOS mode, terminals of C2 and C4 are short circuited by setting Vmode* high and turning NMOS 399 on, which couples terminals of C2 and C4 together at a virtual ground. In this configuration, C1/C2 form a first capacitive attenuator and C3/C4 form a second capacitive attenuator. Further, in NMOS mode, Vbias is set to higher bias voltage to turn PMOS devices 201 and 202 off. However, S+ and S− on VCO output terminals 310 and 311 may have large swings that could turn on the PMOS devices.

Figure 4B:
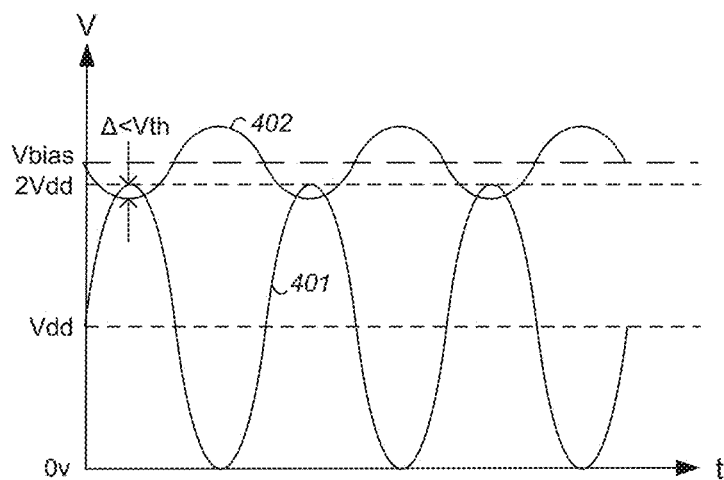
FIG. 4B illustrates signals for an example voltage controlled oscillator in NMOS mode according to an embodiment.

FIG. 4B illustrates example signals for a voltage controlled oscillator according to an embodiment. Signal 401 may be S+ on one terminal of the VCO output at 310, for example. In NMOS mode, S+ may have an amplitude of Vdd centered around Vdd and a swing between 2 Vdd and ground. The large swing on the output terminals 310 and 311 may be problematic because PMOS devices 201 and 202 are biased off, but the sources of these devices are at Vdd. Also, as illustrated in FIG. 4B, when S− is coupled through capacitors C3/C4 the signal 402 in FIG. 4B at the gate of PMOS device 201 will be out of phase with the signal 401 in FIG. 4B at the drain of PMOS device 201. In one embodiment, signal 402 may oscillate around Vbias, which is above 2 Vdd, for example, as shown in FIG. 4B. However, if signal 402 is not sufficiently attenuated, the voltage on the gate of PMOS device 201 could fall below the voltage on the drain when signal 402 is at a minimum and signal 401 is at a maximum. If the overlap is greater than the threshold voltage of the PMOS device 201, then the PMOS device could turn on, which may create a load on the output terminal of the VCO, for example, and degrade performance. In one embodiment, Vbias is set so that a difference between a peak amplitude of signals S+ and S− on the drains of the PMOS devices and attenuated signals on the control terminals of the PMOS devices is below a threshold (Δ<Vth) so the PMOS devices are off. The PMOS devices may be biased based on the attenuation of the series capacitors. For example, in one embodiment the values of C1 and C3 are approximately equal to, but slightly larger than, the capacitance values of C2 and C4, respectively. Example values for the circuit in FIG. 4A may be C1=C3=700-800 femtofarads and C2=C4=500-600 femtofarads, Vbias=1.3 v and Vdd=0.6-0.7 v. Accordingly, in NMOS mode, Vbias turns the PMOS devices off, and the series capacitors may selectively attenuate the VCO output signals at the gates of the PMOS devices to ensure the PMOS devices remain off over a fully cycle of the signal period, for example. One advantage of using series capacitances C1 and C2 and C3 and C4 is that the equivalent capacitance Ceq on the VCO output terminals 310 and 311 is reduced, thereby reducing the capacitive loading on the VCO output terminals and allowing for higher speeds, for example. The virtual ground common mode node may also improve phase noise and extend the tuning range (e.g., in CMOS node). An NMOS switch 399 may also have the advantage of lower "on" resistance and better phase noise, for example.

Figure 4C:
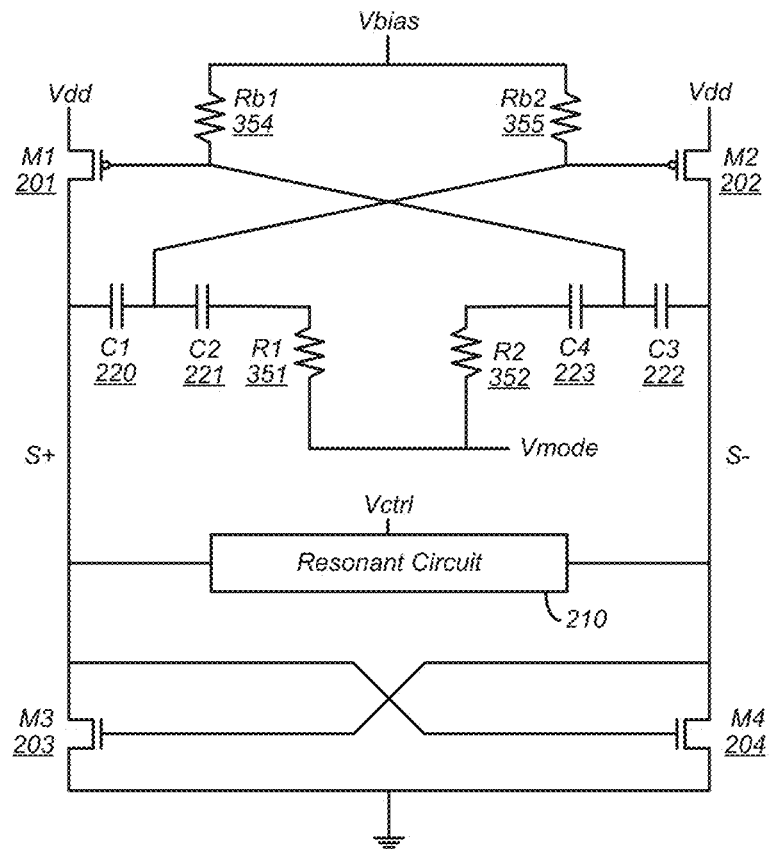
FIG. 4C illustrates the operation of the circuit of FIG. 3 in a CMOS mode according to an example embodiment.

FIG. 4C illustrates the operation of the circuit of FIG. 3 in a CMOS mode according to an example embodiment. In CMOS mode, terminals of C2 and C4 are open circuited by setting Vmode* low and turning NMOS 399 off. Vmode is high and terminals of C2 and C4 are coupled to high impedance resistors R1 and R2. In this configuration, C2 and C4 are effectively removed from the capacitive divider circuit, and signals S+ and S− may be AC coupled substantially without attenuation to the gates of PMOS devices 201 and 202, for example. Further, in CMOS mode, Vbias is set to lower bias voltage to turn on PMOS devices 201 and 202. Accordingly, both the NMOS devices 203 and 204 and the PMOS devices 201 and 202 work together to generate VCO output signals S+ and S−. Since PMOS devices 201 and 202 have sources coupled to supply voltage Vdd, the swing of signals S+ and S− may be bound between Vdd and ground in this configuration.

Figure 5:
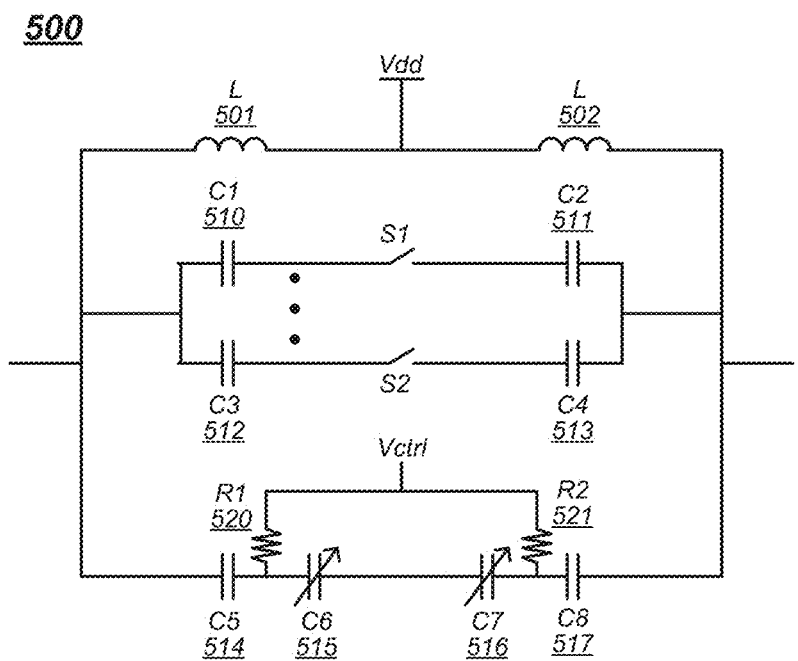
FIG. 5 illustrates one example resonant circuit.

FIG. 5 illustrates one example resonant circuit, which is sometimes referred to as a "tank" circuit (or LC tank) since it holds the oscillation energy at the oscillation frequency. Resonant circuit 500 includes inductors 501 and 502, a capacitance tuning network including capacitors 510-513 and switches S1 and S2, for example, and a voltage controlled capacitive tuning network including capacitors 514 and 517 and variable capacitances 515 and 516 configured to receive a control voltage Vctrl through resistors 520 and 521. Resonant circuit 500 may form an impedance across cross coupled NMOS transistors, for example, and Vctrl may be coupled to a common mode node forming a virtual AC ground. The LC tank is made tunable by implementing the 'C' of the LC tank using a voltage controlled capacitance (aka, a varactor). In this example, control voltage Vctrl is coupled through resistors 520 and 521 to change the capacitance of C5/C6 and C7/C8. C6 and C7 may also be digitally programmed, for example, which together with C1-C4 may be used to set the frequency of a VCO, for example.

Figure 6A:
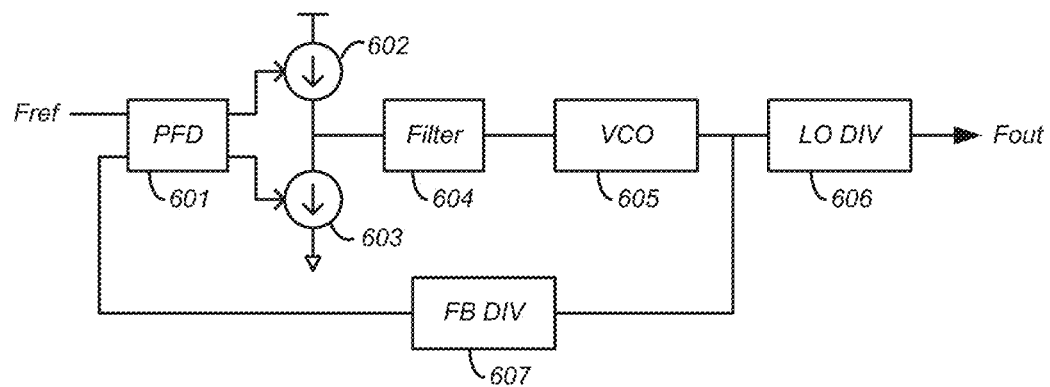
FIGS. 6A-B illustrate example applications of particular embodiments.
Figure 6B:
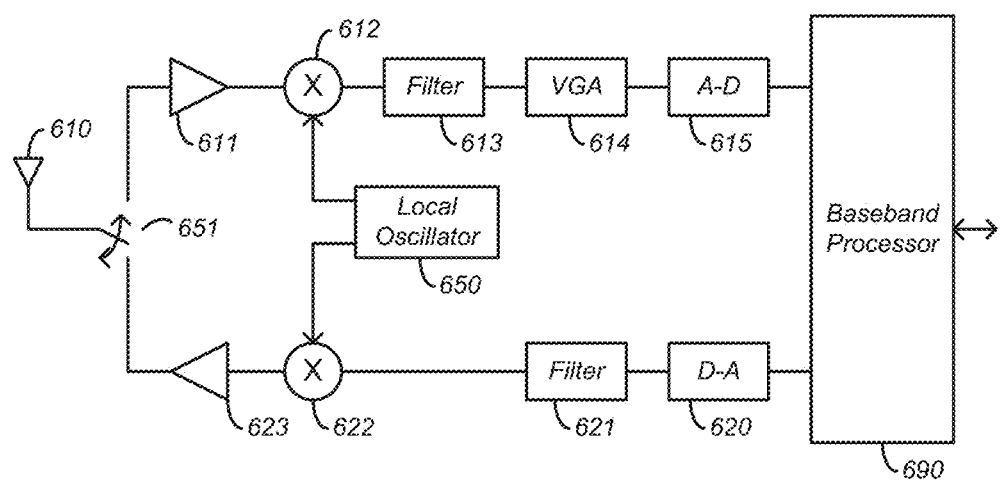

FIGS. 6A-B illustrate example applications of particular embodiments. FIG. 6A illustrates a VCO in a phase locked loop to produce a periodic signal Fout. The circuit may receive a reference frequency Fref in a phase frequency detector (PFD) 601. A second input of the PFD 601 receives a periodic signal from VCO 605. PFD 601 may compare phase and/or frequency of the input signals and send control signals to charge pump current sources 602 and 603 to increase a voltage or decrease a voltage at the input of a filter 604, for example. The voltage is filtered and provided as an input to VCO 605. Accordingly, if the VCO output frequency is below Fref, the voltage may be increased to increase the frequency at the other input of the PFD. Alternatively, if the VCO output frequency is above Fref, the voltage may be decreased to decrease the frequency at the other input of the PFD, for example. In this example, the VCO output frequency may be much higher than Fref, so a feedback divider (FB DIV) 607 is provided between the output of the VCO and the input of the PFD. In some applications, Fref may be coupled through a divider to achieve different frequency relationships at the output. Accordingly, Fref can be used to generate signal frequencies above Fref. In this example, the output of the VCO is divided by a local oscillator divider (LO DIV) 606 to produce an output signal having a frequency Fout. In some applications, the dividers may be programmable and/or reconfigurable to generate different local oscillator output signal frequencies.

FIG. 6B illustrates a wireless application of a VCO. In this example, a wireless communication channel may include a VCO as described above configured in a phase locked loop to generate local oscillator signals having different frequencies to modulate and demodulate wireless signals, for example. A receive path may include an antenna 610 coupled to an input of a low noise amplifier (LNA) 611, which may amplify a received RF signal. An output of LNA 611 is coupled to a demodulator (e.g., a mixer) that also receives a local oscillator (LO) signal from an local oscillator 650 generated as described in FIG. 6A, for example. The LO signal may downconvert a received modulated RF signal down to a baseband frequency. The baseband signal may be received and filtered by filter 613, amplified by variable gain amplifier (VGA) 614, and converted to digital signals by an analog-to-digital converter (A-D) 615. The digital signals may then be processed by baseband processor 690.

A transmit path may include receiving digital data to be transmitted in baseband processor 690, where the data may be coded for transmission according to a RF transmission protocol, for example. The coded digital data signals may be converted to an analog baseband signal by digital to analog converter 620, and filtered by filter 621. The filtered analog baseband signal may be upconverted by modulator (mixer) 622, which also receives an LO signal from local oscillator 650 generated using a VCO as described herein, for example. The baseband signal is upconverted to RF and driven onto the antenna using a power amplifier 623. A switch 651 may, in some application channel input signals from the antenna to the LNA and output signals from the power amplifier to the antenna, for example.

Figure 7:
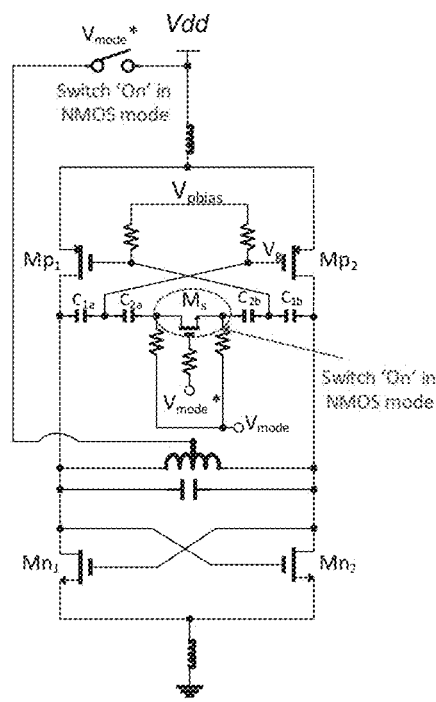
FIG. 7 illustrates another example voltage controlled oscillator circuit according to an embodiment.

FIG. 7 illustrates another example voltage controlled oscillator circuit according to an embodiment. In one embodiment, the present disclosure includes a circuit comprising an LC oscillator reconfigurable between NMOS and CMOS modes comprising a first and second capacitors coupled in series on a first terminal of an LC circuit, second and third capacitors coupled in series on a second terminal of the LC circuit, and a switch to selectively couple/decouple the first, second, third, and fourth capacitors in series to form a virtual ground, wherein cross coupled PMOS devices have gates coupled to intermediate nodes between the first/second capacitors and third/fourth capacitors. In one embodiment, the switch is an NMOS transistor. In one embodiment, a voltage is coupled to distal terminals of the first/second series capacitors and the third/fourth series capacitors when the switch is open and the first, second, third, and fourth capacitors are not coupled in series.

In this example, a CMOS/NMOS mode switch (Ms) is AC connected to the two gate terminals of the PMOS pair through C2a and C2b. The switch is located in the common-mode node (virtual ground) between capacitors C2a and C2b.

An RF signal path couples the drain of NMOS device Mn1 on one side of the LC circuit, through capacitor C1a, to the gate of PMOS device Mp2. Similarly, an RF signal path couples the drain of NMOS device Mn2 on the other side of the LC circuit, through capacitor C1b, to the gate of PMOS device Mp1.

When Vmode is high, Ms is OFF and terminals of capacitors C2a and C2b are coupled to a high voltage (Vmode) through two large resistors, for example. In this state, the RF signal path cross couples the PMOS devices in the circuit and both the NMOS and PMOS devices switch at the resonant frequency (i.e., CMOS operation).

When Vmode is low, Ms is ON due to Vmode* (the inverse of Vmode) and terminals of capacitors C2a and C2b are coupled together to form a virtual ground, and the RF signals are AC coupled to ground. In this state, only the NMOS devices switch at the resonant frequency (i.e., NMOS operation), and power is supplied through the inductor in the LC switch via a center tap, for example.

The reconfiguration technique illustrated in FIG. 7 and other embodiments may result in improved phase noise & tuning range in CMOS mode. In NMOS mode, the additional capacitance added to the VCO tank is C1a//C2a & C1b//C2b. By properly sizing C2a and C2b, the additional capacitances can be largely reduced, resulting in a much wider tuning range.

In the example shown in FIG. 7, an NMOS device is used for the Ms switch versus a PMOS device for the Ms switching, which may result in improved 'ON' resistance and phase noise, for example.

Advantages of certain embodiments, such as the example shown in FIG. 7, include improved phase noise, improved tuning range, and a VCO architecture that facilitates low supply voltage operation. For example, with respect to phase noise, advantages of the example above may include:
  i. No switches and parasitic resistances at RF signal path.
  ii. Mode switch ($M_s$) is located at the common mode (virtual ground) with much better 'on' resistance.
  iii. NMOSFET (better 'on' resistance than PMOS) can be used for the mode switch.

For example, with respect to tuning range, advantages of certain example above may include:
  i. In NMOS mode, AC-couple capacitors ($C_{2a}$ & $C_{2b}$ in FIG. 7) reduce additional capacitance added into the VCO tank. $C_{1a}//C_{2a}$ & $C_{1b}//C_{2b}$ results in less additional capacitances, which may improve tuning ranges.
  ii. In CMOS mode, no mode switches are located in RF signal paths. This results in less parasitic capacitances and better tuning ranges.

As another example, with respect to low supply voltages, advantages of certain examples above may include:

i. The VCO can operate with a single low supply voltage (≤1 Volt) for both CMOS and NMOS mode.

ii. Simplifying the power network and regulator design.

While some of the above circuits illustrate examples of NMOS cross coupled transistors and PMOS transistors having gates that are coupled through capacitive attenuators, it is to be understood that other designs may have PMOS cross coupled transistors and NMOS transistors having gates coupled through capacitive attenuators (i.e., the circuit device types and polarity may be "flipped") as is well understood by those skilled in the art in light of the present disclosure.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. For example, while certain circuits above are illustrated using PMOS and NMOS, it is to be understood that other transistor types could be used. Based on the above disclosure and the following claims, other arrangements, embodiments, implementations and equivalents may be employed without departing from the scope of the present disclosure as defined by the claims.

What is claimed is:

1. A circuit comprising:
   a voltage controlled oscillator comprising one or more inductors, one or more capacitors, and at least two cross coupled transistors;
   a first transistor having an opposite device type than the cross coupled transistors;
   a second transistor having the opposite device type than the cross coupled transistors;
   first and second capacitive attenuator circuits, the first capacitive attenuator circuit including a first capacitor series coupled with a second capacitor, the second capacitive attenuator circuit include a third capacitor series coupled with a fourth capacitor, wherein the first transistor is cross coupled to the second transistor through the first capacitor of the first capacitive attenuator circuit and the second transistor is cross coupled to the first transistor through the third transistor of the second capacitive attenuator circuit; and
   a first circuit coupling the second capacitor of the first capacitive attenuator circuit to the fourth capacitor of the second attenuator circuit exclusive of the cross couplings between the first transistor and the second transistor.

2. The circuit of claim 1 wherein, in a first mode, the first and second capacitive attenuator circuits attenuate a signal across the voltage controlled oscillator when the first and second transistors are turned off, and wherein, in a second mode, the first and second capacitive attenuator circuits do not attenuate the signal across the voltage controlled oscillator when the first and second transistors are turned on in a cross coupled configuration.

3. The circuit of claim 1 further comprising a switch configured between the first and second capacitive attenuator circuits, wherein the switch is closed in a first mode and the switch is open in a second mode.

4. The circuit of claim 1 further comprising a bias voltage coupled to control terminals of the first and second transistors, wherein in a first mode the bias voltage is set to a first voltage to turn off the first and second transistors and in a second mode the bias voltage is set to a second voltage to turn on the first and second transistors.

5. A circuit comprising:
   a first transistor of a first conductivity type, the first transistor having a control terminal, a first terminal, and a second terminal;
   a second transistor of the first conductivity type, the second transistor having a control terminal, a first terminal, and a second terminal;
   a third transistor of a second conductivity type, the third transistor having a control terminal, a first terminal, and a second terminal, wherein the second terminal of the third transistor is coupled to the second terminal of the first transistor;
   a fourth transistor of the second conductivity type, the fourth transistor having a control terminal, a first terminal, and a second terminal, wherein the second terminal of the fourth transistor is coupled to the second terminal of the second transistor;
   a resonant circuit configured between the second terminal of the third transistor and the second terminal of the fourth transistor;
   a first capacitor having a first terminal and a second terminal, wherein the first terminal of the first capacitor is coupled to the second terminal of the first transistor and the second terminal of the first capacitor is coupled to the control terminal of the second transistor;
   a second capacitor having a first terminal and a second terminal, wherein the first terminal of the second capacitor is coupled to the second terminal of the first capacitor;
   a third capacitor having a first terminal and a second terminal, wherein the first terminal of the third capacitor is coupled to the second terminal of the second transistor and the second terminal of the third capacitor is coupled to the control terminal of the first transistor; and
   a fourth capacitor having a first terminal and a second terminal, wherein the first terminal of the fourth capacitor is coupled to the second terminal of the third capacitor.

6. The circuit of claim 5 wherein the first and second transistors are off in a first mode of operation and the first and second transistors are on in a second mode of operation.

7. The circuit of claim 5 further comprising a switch having a first terminal coupled to the second terminal of the second capacitor and a second terminal coupled to the second terminal of the fourth capacitor.

8. The circuit of claim 7 wherein the switch is an NMOS transistor.

9. The circuit of claim 5 further comprising:
   a first resistor having a first terminal coupled to the second terminal of the second capacitor and a second terminal coupled to a mode control voltage; and
   a second resistor having a first terminal coupled to the second terminal of the second capacitor and a second terminal coupled to a mode control voltage.

10. The circuit of claim 5 further comprising:
    a first resistor having a first terminal coupled to the control terminal of the first transistor and a second terminal coupled to a bias voltage; and
    a second resistor having a first terminal coupled to the control terminal of the second transistor and a second terminal coupled to the bias voltage.

11. The circuit of claim 5 wherein the control terminals of the first and second transistors are coupled to a first bias voltage in a first mode of operation to turn off the first and second transistors, and the control terminals of the first and second transistors are coupled to a second bias voltage in a second mode of operation to turn on the first and second transistors.

12. The circuit of claim 5 wherein the first transistor and the second transistor are PMOS transistors and the third transistor and fourth transistor are NMOS transistors.

13. The circuit of claim 5 wherein the resonant circuit receives a control voltage to set a frequency of oscillation.

14. The circuit of claim 5 wherein, in a first mode, the second terminal of the second capacitor is coupled to the second terminal of the fourth capacitor and a first signal on the second terminal of the first transistor is attenuated by the first and second capacitors to the control terminal of the second transistor and a second signal on the second terminal of the second transistor is attenuated by the third and fourth capacitors to the control terminal of the first transistor, and in a second mode, the second terminal of the second capacitor and the second terminal of the fourth capacitor are coupled to a high impedance, and in accordance therewith, the first signal is AC coupled to the control terminal of the second transistor and the second signal is AC coupled to the control terminal of the first transistor.

15. The circuit of claim 5 wherein the control terminals of the first and second transistors are coupled to a bias voltage, and in accordance therewith, a difference between a peak amplitude of first and second signals on the second terminals of the first and second transistors and first and second attenuated signals on the control terminals of the first and second transistors is below a threshold so the first and second transistors are off.

16. The circuit of claim 5 wherein the first capacitor is approximately equal to the second capacitor and the third capacitor is approximately equal to the fourth capacitor.

17. The circuit of claim 16 wherein the first capacitor is approximately equal to, but larger than, the second capacitor and the third capacitor is approximately equal to, but larger than, the fourth capacitor.

18. The circuit of claim 5 further comprising a wireless communication channel, wherein the first, second, third, and fourth transistors are configured in a phase locked loop to generate local oscillator signals having different frequencies.

19. The circuit of claim 1, wherein the first circuit comprises a mode control circuit.

* * * * *